United States Patent
Ho et al.

(10) Patent No.: US 7,622,326 B2
(45) Date of Patent: Nov. 24, 2009

(54) MANUFACTURING PROCESS OF A CHIP PACKAGE STRUCTURE

(75) Inventors: Kwun-Yao Ho, Taipei Hsien (TW); Moriss Kung, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 498 days.

(21) Appl. No.: 11/308,925

(22) Filed: May 26, 2006

(65) Prior Publication Data

US 2006/0231863 A1 Oct. 19, 2006

Related U.S. Application Data

(62) Division of application No. 10/250,186, filed on Jun. 11, 2003, now abandoned.

(30) Foreign Application Priority Data

Feb. 11, 2003 (TW) .............................. 92102733 A

(51) Int. Cl.
H01L 21/44 (2006.01)
H01L 21/48 (2006.01)
H01L 21/50 (2006.01)

(52) U.S. Cl. ..................... 438/106; 438/108; 257/778

(58) Field of Classification Search ................ 438/106, 438/108; 257/778
See application file for complete search history.

(56) References Cited

U.S. PATENT DOCUMENTS

| 5,909,058 | A | * | 6/1999 | Yano et al. ................. 257/712 |
| 5,982,018 | A | * | 11/1999 | Wark et al. ................. 257/532 |
| 6,370,013 | B1 | * | 4/2002 | Iino et al. ................. 361/306.3 |
| 6,583,515 | B1 | * | 6/2003 | James et al. ................ 257/779 |

* cited by examiner

*Primary Examiner*—Thien F Tran
(74) *Attorney, Agent, or Firm*—Jianq Chyun IP Office

(57) ABSTRACT

A manufacturing process of a chip package structure is provided. The manufacturing method uses fine pitch circuit processes, such as a TFT-LCD process or an IC process, to increase layout density and shorten electrical transmission pathways so that a higher electrical performance level is attained. First, a multi-layered interconnection structure with high-density bonding pads and fine pitch circuit is formed over a hard support base plate having a large area and high degree of planarity. A die is attached to a top surface of the multi-layered interconnection structure. A plurality of opening is formed on a bottom surface of the support base plate. Contacts are positioned into the openings in the support base plate such that the contacts are electrically connected to an inner circuit within the multi-layered interconnection structure.

11 Claims, 4 Drawing Sheets

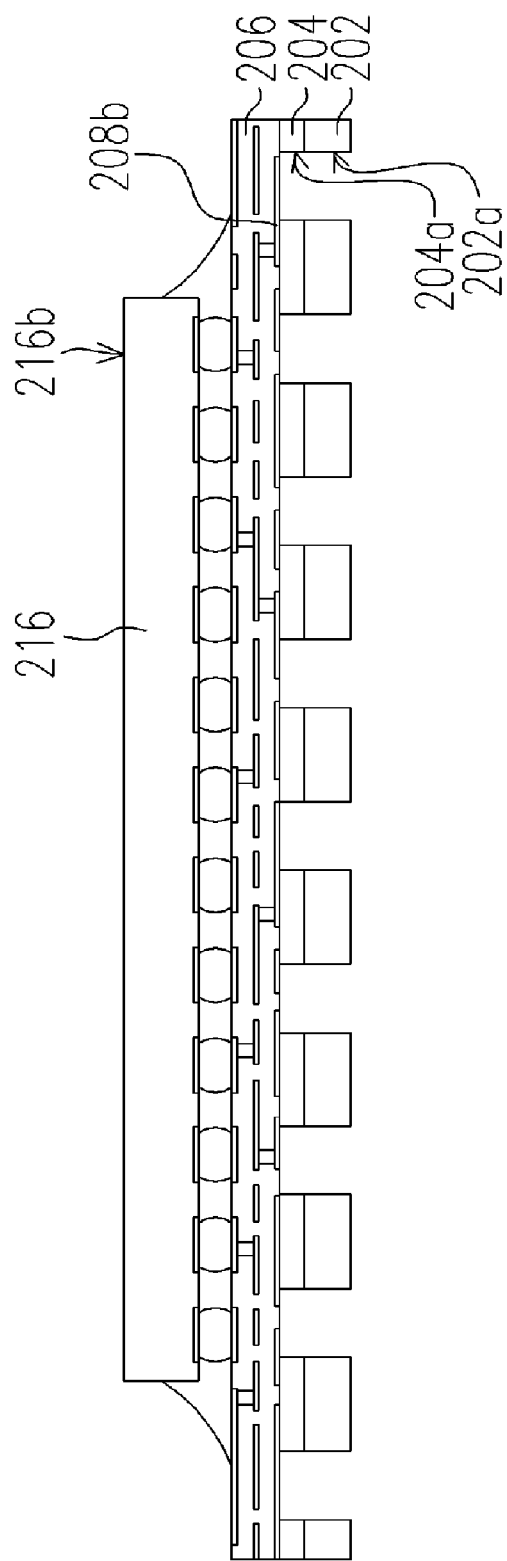
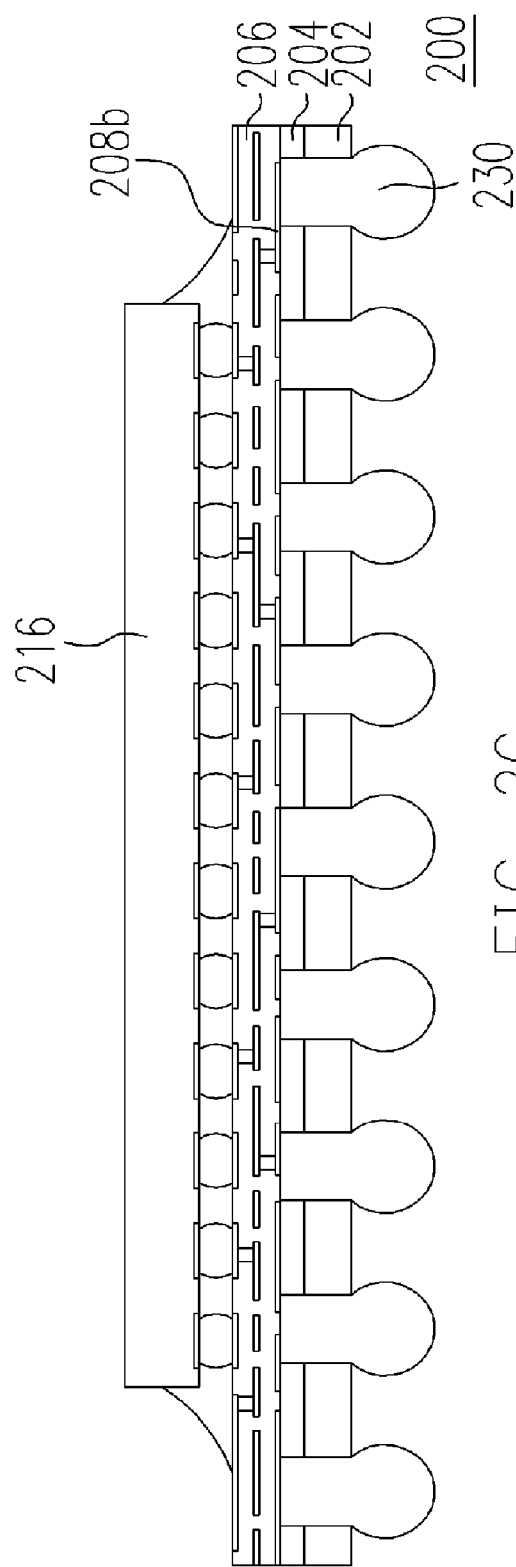

MANUFACTURING PROCESS OF A CHIP PACKAGE STRUCTURE

CROSS-REFERENCE TO RELATED APPLICATION

This is a divisional application of application Ser. No. 10/250,186, filed on Jun. 11, 2003 now abandoned, which claims the priority benefit of Taiwan patent application serial no. 92102733, filed on Feb. 11, 2003 and is now pending. The entirety of each of the above-mentioned patent applications is hereby incorporated by reference herein and made a part of this specification.

BACKGROUND OF THE INVENTION

1. Field of Invention

The present invention relates to a chip package structure and manufacturing process thereof. More particularly, the present invention relates to a chip package structure with an insulating material fabricated hard support plate therein and manufacturing process thereof.

2. Description of Related Art

Flip chip (FC) interconnect technology is a technique of joining a die and a carrier together to form a chip package. The active surface of the die normally has an array of die pads each having a bump thereon and the carrier also has a series of corresponding contacts. To assemble the die and the carrier together, the die is flipped over so that the bumps align with and form electrical or mechanical connections with corresponding contacts on the carrier so that signals from the die can be transmitted to the carrier via the bumps. Thereafter, the signals can be relayed to an external electronic device through one of the internal circuits formed within the carrier. Note that flip chip technology is particularly suitable for producing a chip package requiring a high pin count. Other advantages of a flip chip package include a capacity for reducing the area occupation of the chip package and a capacity for shortening of the average signal transmission pathway. With these advantages, it has been broadly applied to various types of chip package structures including the flip chip ball grid array (FC/BGA) and the flip chip pin grid array (FC/PGA).

FIG. 1 is a schematic cross-sectional view showing the structure of a conventional flip chip ball grid array package. As shown in FIG. 1, the chip package 100 comprises a substrate 110, a plurality of bumps 120, a die 130 and a plurality of solder balls 140. The substrate 110 has a top surface 112 and a bottom surface 114. The substrate 110 furthermore comprises a plurality of bump pads 116a and a plurality of ball pads 116b. The die 130 has an active surface 132 and a back surface 134. The active surface 112 of the die 130 broadly refers to the surface where all active devices (not shown) reside. The active surface 132 of the die 130 furthermore comprises a plurality of die pads 136 each serving as a medium for signal input or signal output from the die 130. Furthermore, the die pads 136 and the bump pads 116a are positioned to correspond with each other. The bumps 120 connect one of the die pads 136 with a corresponding bump pad 116a on the other side electrically and mechanically. The solder balls 140 are attached to the respective ball pads 116 for connecting with an external electronic device electrically and mechanically.

In the process of manufacturing a conventional chip package, all circuits within the substrate 110 and contacts 116a, 116b on the top surface 112 of the substrate 110 must be fabricated prior to attaching the die 130 onto the top surface 112 of the substrate 110. Thereafter, an underfill layer 150 is applied to fill the space between the top surface 112 of the substrate 110 and the active surface 132 of the die 130. This underfill layer 150 protects the bump pads 116a, the die pads 136 and the exposed portion of the bumps 120. Furthermore, the underfill layer 150 also buffers against thermal strain mismatch between the substrate 110 and the die 130 when subjected to heat. Thus, the die pad 136 is able to connect electrically or mechanically with an external device through the bump 120 and the bump pad 116a, the internal circuits within the substrate 110, the ball pad 116b and the solder ball 140.

To increase computational speed and lower production cost of a chip, die area and pitch between the die pads must be reduced. In other words, density of the die pads must increase. When a die having high-density die pads needs to integrate with a ball grid array (BGA) or a pin grid array (PGA) package using the flip chip technique, high-density bump pads and fine pitch circuit within the substrate must be used. In other words, with the die flipped over and attached to the top surface of the substrate, the die pad is able to extend its connection with an external device via the routing wires within the substrate and a ball or a pin at the bottom surface of the substrate.

At present, the most popular material for fabricating the substrate of a flip chip ball grid array (FC/BGA) or a flip chip pin grid array (FC/PGA) is ceramic and organic material. However, an organic substrate with dielectric layers fabricated using organic material is the most common. Note that organic substrate is deeply affected by thermal expansion of the dielectric layer. Hence, the smallest possible line width and line pitch that can be produced within the organic substrate in large quantities are 25 µm and 25 µm respectively. In addition, the largest size of a piece of uncut organic substrate is only 610×610 cm$^2$. Yet, as the die pad density continues to increase, integrating a die having high-density die pads with a substrate to form a package at a minimum production cost is important issue.

SUMMARY OF THE INVENTION

Accordingly, one object of the present invention is to provide a manufacturing process of a chip package structure, which is capable of producing a multi-layered interconnection structure with high-density bonding pads (bump pads) and fine pitch circuit so that the production cost of a chip package structure is lowered.

To achieve these and other advantages and in accordance with the purpose of the invention, as embodied and broadly described herein, the invention provides a chip package structure. The chip package structure comprises a multi-layered interconnection structure, at least a die, an isolation base layer and a support base plate. The multi-layered interconnection structure has a top surface and a bottom surface. The multi-layered interconnection structure furthermore comprises an inner circuit with a plurality of bonding pads on the bottom surface. The die is positioned on the top surface of the multi-layered interconnection structure and electrically connected to the inner circuit within the multi-layered interconnection structure. In addition, the isolation base layer and the support base plate are positioned on the bottom surface of the multi-layered interconnection structure. Furthermore, the support base plate has a plurality of first openings and the isolation base layer furthermore has a plurality of second openings such that each first opening is linked with a corresponding second opening to expose the bonding pads.

This invention also provides a method of fabricating a chip package. First, a support base plate with a top surface and a bottom surface is provided. Thereafter, a multi-layered interconnection structure is formed over the support base plate. The multi-layered interconnection structure has an inner circuit with a plurality of bonding pads located on a surface close to the support base plate. At least a die is attached to a surface of the multi-layered interconnection structure away from the support base plate. Furthermore, the die is electrically connected to the inner circuit within the multi-layered interconnection structure. A plurality of first openings is formed on the support base plate such that each first opening exposes one of the bonding pads.

According to one preferred embodiment of this invention, the support base plate is fabricated using a hard insulating material including glass, quartz or ceramics. The method of forming first openings in the base support plate includes ultrasonic piercing, laser drilling or etching. In addition, the die is attached and electrically connected to the inner circuit within the multi-layered interconnection structure by performing a flip chip bonding, a wire bonding or a thermal compression bonding process. Furthermore, a plurality of contacts can be fabricated on a surface of the support base plate away from the die such that each contact connects electrically with a corresponding bonding pad. These contacts are, for example, solder balls, pins or electrode blocks.

In brief, this invention still deploys conventional techniques and production stations for fabricating thin film transistor liquid crystal display (TFT-LCD) panel or integrated circuit (IC) to build the chip package. On a support base plate (fabricated using glass, quartz or ceramic) with a large surface area and a high degree of planarity, a multi-layered interconnection structure with high-density bonding pads (bump pads) and fine pitch circuit is formed. Thereafter, a flip chip process is carried out to attach the die onto the top surface of the multi-layered interconnection structure. Next, a plurality of openings is formed on the bottom surface of the support base plate. Finally, contacts are formed in the openings of the support base plate so that the contacts are electrically connected to the respective bonding pads on the multi-layered interconnection structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 2A to 2G are schematic cross-sectional views showing the steps for fabricating a chip package structure according to one preferred embodiment of this invention.

DESCRIPTION OF THE PREFERRED EMBODIMENTS

Figure 1:
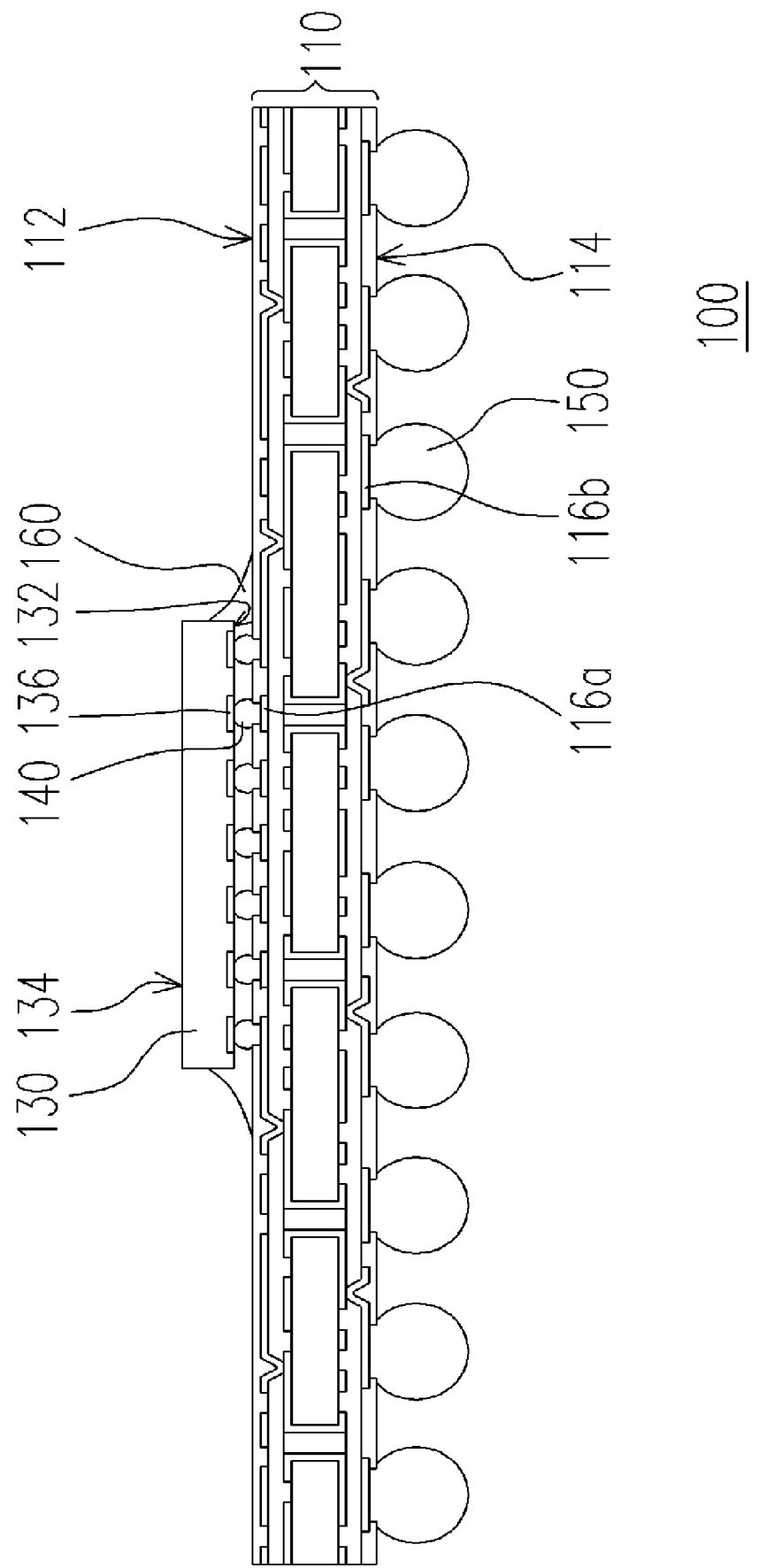
FIG. 1 is a schematic cross-sectional view showing the structure of a conventional flip chip ball grid array package.

Reference will now be made in detail to the present preferred embodiments of the invention, examples of which are illustrated in the accompanying drawings. Wherever possible, the same reference numbers are used in the drawings and the description to refer to the same or like parts.

Figure 2A:

FIGS. 2A to 2G are schematic cross-sectional views showing the steps for fabricating a chip package structure according to one preferred embodiment of this invention. First, as shown in FIG. 2A, a support base plate 202 is provided. The support base plate 202 is fabricated using an insulating material including, for example, glass, quartz or ceramics. In addition, the support base plate must have a high degree of surface planarity.

Figure 2B:
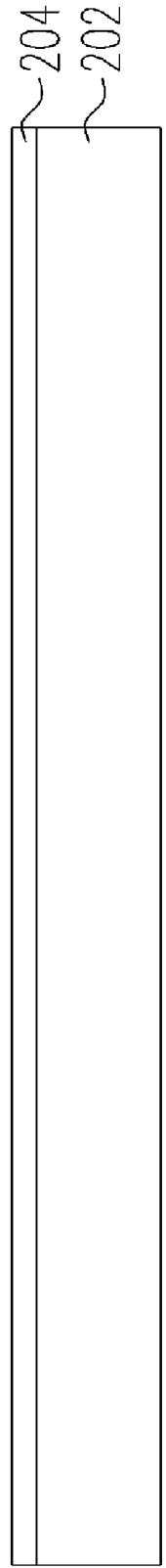

As shown in FIG. 2B, an isolating base layer 204 is formed over the support base plate 202. The isolating base layer 204 can be planarized optionally so that the surface of the isolating base layer 204 can have a high degree of planarity as well. The isolating base layer 204 is fabricated using a material including, for example, polymer, polyester, polyimide, epoxy resin, acrylic and benzocyclobutene (BCB). Furthermore, the isolating base layer 204 can be attached to the surface of the support base plate 202 by performing either a film attachment process or a film coating process.

Figure 2C:
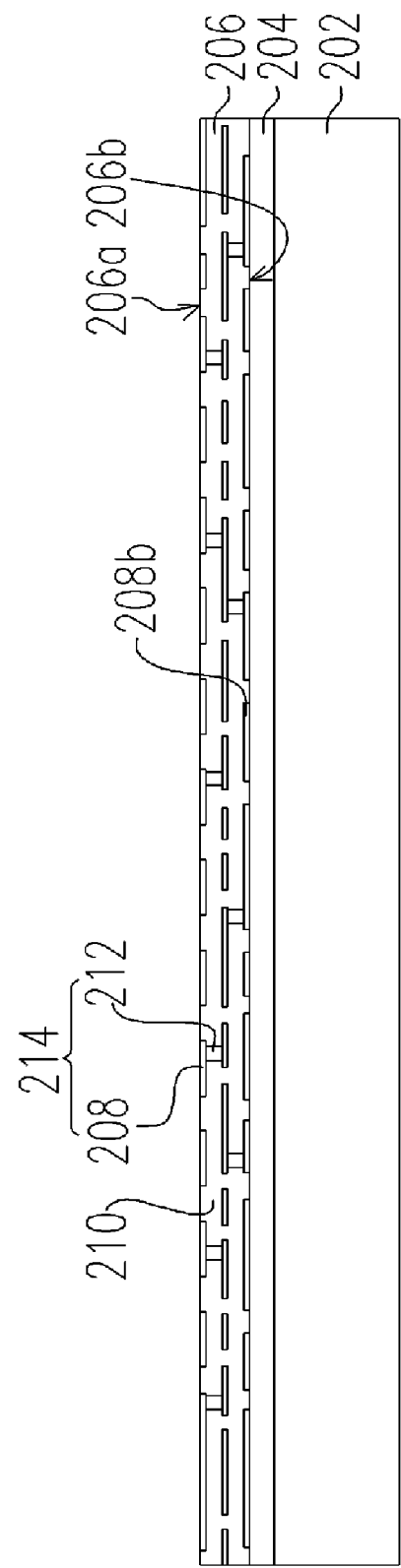

As shown in FIG. 2C, a multi-layered interconnection structure 206 is formed over the isolation base layer 204. The multi-layered interconnection structure 206 comprises a plurality of patterned conductive layers 208, at least one dielectric layer 210 and a plurality of conductive vias 212. The conductive layers 208 are sequentially stacked over the isolating base layer 204 and the dielectric layers 210 are inserted into the space between two neighboring conductive layers 208. The conductive vias 212 pass through the respective dielectric layers 210 to connect two neighboring conductive layers 208. These conductive layers 208 and conductive vias 212 together form an inner circuit 214. Furthermore, the inner circuit 214 is connected with a plurality of bonding pads 208b at the bottom surface 206b of the multi-layered interconnection structure 206. The conductive layers 208 are fabricated using copper, aluminum or an alloy of the two, for example. The dielectric layer 210 is fabricated using a polymer material including, for example, silicon nitride, silicon oxide or epoxy resin. Note that the isolating base layer 204 is set up over the support base plate by selection. Hence, if the multi-layered interconnection structure 206 can be directly attached to the support base plate 202, there is no need to form the isolating base layer 204 over the support base layer 202. However, this condition is not shown in FIGS. 2B to 2G.

Because the multi-layered interconnection structure 206 is formed over the isolating base layer 204 using techniques related to the fabrication of liquid crystal display panels or integrated circuits, line width and line pitch of the inner circuit 214 are within the range 1~50 µm. In particular, the line width and line pitch of the inner circuit 214 can be fabricated to a fine precision between one to a few micrometers. Hence, compared with the organic dielectric substrate 110 in FIG. 1, the multi-layered interconnection structure 206 in this invention is able to provide higher density of bonding pads (bump pads) and finer pitch circuit. Furthermore, in the process of forming the multi-layered interconnection structure 206 over the isolating base layer 204, passive components (not shown) can be fabricated in the interior or on the top surface 206a of the multi-layered interconnection structure 206 and electrically connected to the inner circuit 214 as well. In addition, the inner circuit 214 may include some special routing design for forming special passive components such as capacitors or inductors.

Figure 2D:
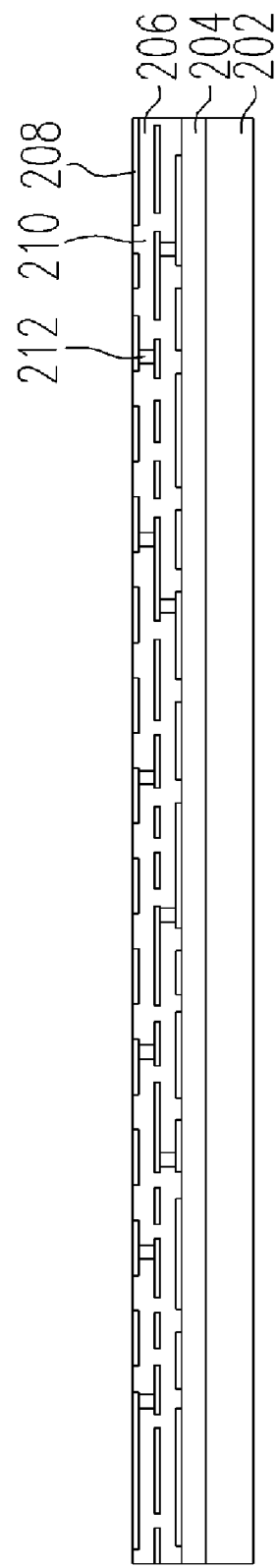

As shown in FIG. 2D, a polishing operation may be carried out to trim down the thickness of the support base plate 202 after fabricating the multi-layered interconnection structure 206.

Figure 2E:
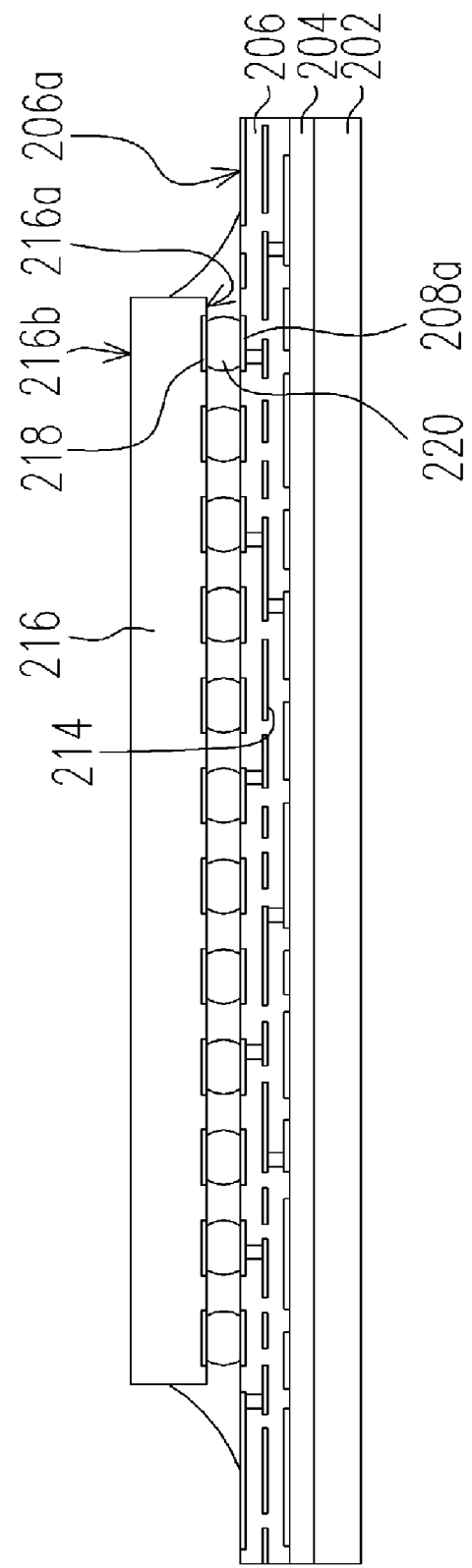

As shown in FIG. 2E, a flip chip method can be applied to position at least a die 216 on a surface of the multi-layered interconnection structure 206 furthest from the support base plate 202. The die 216 is furthermore electrically connected to the inner circuit 214. Obviously, the aforementioned process of trimming the support base plate 202 can be carried out after the attachment of the die 216 to the multi-layered interconnection structure 206. In addition, the die 216 has an active surface 216a and a back surface 216b. The die 216 furthermore has a plurality of die pads 218 on the active surface 216a. A plurality of bumps 220 are used to connect the die pads 218 electrically or mechanically with corresponding bump pads 208a. In other words, the die 216 is flipped over and attached to the multi-layered interconnection structure 206 such that the die 216 is electrically connected to the inner circuit 214. Obviously, the die 216 may connect electrically with the inner circuit 214 inside the multi-layered interconnection structure 206 by performing either a wire-bonding process or a thermal compression bonding process.

As shown in FIG. 2F, a plurality of first openings 202a is formed in the support base plate 202 by ultrasonic piercing, laser drilling or etching. A similar method can be applied to form a plurality of second openings 204a in the isolating base layer 204. Each second opening 204a and its corresponding first opening 202a are linked together to expose one of the bonding pads 208b.

As shown in FIG. 2G, a plurality of contacts 230 is formed on the surface of the support base plate 202 furthest from the die 216. Each contact 230 is connected to a corresponding bonding pad 208b. The contacts 230 are conductive structures such as solder balls, pins or electrode blocks. These conductive structures are set up to form an array on the bottom surface of the chip package structure 200.

Additionally, after attaching the contacts 230 to the bonding pads 208b in FIG. 2G, a singulation operation may be performed to separate a batch of single chip package structures 200 into individual packages. Alternatively, the singulation operation may be performed prior to attaching the contacts 230 to the bonding pads 208b in FIG. 2F. Since the chip package structure 200 of this invention also allows the connection of a plurality of dies 216 with an inner circuit 214 inside a multi-layered interconnection structure 206, multiple chip module (MCM) and system in package (SIP) can be fabricated as well. In addition, a heat sink (not shown) can be attached to the back surface 216b of the die 216 optionally. The heat sink is fabricated using a thermal conductive material such as copper, aluminum or an alloy of the two so that cooling rate of the chip package structure 200 is increased.

In summary, this invention deploys conventional techniques and production stations for fabricating thin film transistor liquid crystal display (TFT-LCD) panel or integrated circuit (IC) to build chip packages. Because the technique for manufacturing liquid crystal display panels and integrated circuits is pretty mature by now, a multi-layered interconnection structure with high-density bonding pads (bump pads) and fine pitch circuit can be fabricated on a support base plate exceeding 610×610 cm². Thereafter, a flip chip process, a wire-bonding process or a thermal pressure bonding process is used to attach a die onto the multi-layered interconnection structure. Through the deployment of a glass substrate instead of an organic substrate, the chip package in this invention cost less than a chip package with a conventional design.

Furthermore, the technique used for fabricating a liquid crystal display panel is capable of producing a line width and pitch spacing equal to or smaller than 1 μm. In other words, high-density bonding pads (bump pads) and fine pitch circuit can be fabricated in the multi-layered interconnection structure. With these advantages, the packaging process is able to integrate with a die having denser die pads and form conductive lines inside the multi-layered interconnection structure with precise electrical resistance per unit length.

Similarly, the technique used for fabricating a liquid crystal display panel is capable of producing a line width and pitch spacing equal to or smaller than 1 μm. Therefore, high-density bonding pads (bump pads) and fine pitch circuit can be fabricated in the multi-layered interconnection structure to correspond with a die having a higher die pad density. When the density of die pads on a die is increased, surface area of a unit die can be reduced. In other words, the number of dies that can be fabricated on a given piece of silicon wafer is increased. Ultimately, production cost for each die unit and hence overall cost of producing the chip package is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a chip package, at least comprising the steps of:

providing a support base plate having a top surface and a back surface;

forming a multi-layered interconnection structure over the top surface of the support base plate, wherein the multi-layered interconnection structure has an inner circuit with a plurality of bonding pads on a surface of the multi-layered interconnection structure closest to the support base plate;

attaching at least a die on a surface of the multi-layered interconnection structure furthest from the support base plate, wherein the die is electrically connected to the inner circuit within the multi-layered interconnection structure;

forming a plurality of first openings in the support base plate, wherein each first opening exposes a corresponding bonding pad; and reducing a thickness of the support base plate, wherein the step of reducing the thickness of the support base plate is performed after the step of forming the multi-layered interconnection structure over the top surface of the support base plate but before the step of attaching the die to the surface of the multi-layered interconnection structure or after attaching the die to the surface of the multi-layered interconnection structure but before forming the plurality of first openings on the support base plate.

2. The method of claim 1, wherein the support base plate is fabricated using a material selected from a group consisting of glass, quartz and ceramics.

3. The method of claim 1, wherein after the step of forming a plurality of first openings, further includes forming a plurality of contacts on the bottom surface of the support base plate, and each contact electrically connects with a corresponding bonding pad through the first opening.

4. The method of claim 3, wherein the contact has a profile selected from a group consisting of solder ball, pin and electrode block.

5. The method of claim 1, wherein the inner circuit has a line width between about 1 μm to 50 μm.

6. The method of claim 1, wherein the inner circuit has a line pitch between about 1 μm to 50 μm.

7. The method of claim 1, wherein the step of forming a multi-layered interconnection structure over the support base plate furthermore includes forming at least a passive component on a surface of the multi-layered interconnection structure furthest away from the support base plate such that the passive component is electrically connected to the inner circuit within the multi-layered interconnection structure.

8. The method of claim 1, wherein the step of forming a multi-layered interconnection structure over the support base plate furthermore includes forming at least a passive component inside the multi-layered interconnection structure such that the passive component is electrically connected to the inner circuit within the multi-layered interconnection structure.

9. The method of claim 1, wherein after the step of providing a support base plate, furthermore includes forming an isolating base layer over the top surface of the support base plate, and instead of the step of forming a multi-layered interconnection structure over the support base plate, forming the multi-layered interconnection structure over the isolating base layer, and after the step of forming a plurality of first openings in the support base plate, furthermore includes forming a plurality of second openings in the isolating base layer such that each second openings links with one of the first openings to expose a corresponding bonding pad.

10. The method of claim 1, wherein the step of attaching a die onto a surface of the multi-layered interconnection structure includes performing a flip chip bonding process, a wire-bonding process or a thermal compression bonding process.

11. The method of claim 1, wherein the step of forming a plurality of first openings in the support base plate includes ultrasonic piercing, laser drilling or photolithographic processing and etching.

* * * * *